United States Patent
Liao et al.

(10) Patent No.: US 6,984,848 B2
(45) Date of Patent: Jan. 10, 2006

(54) THIN FILM TRANSISTOR WITH BUFFER LAYER FOR PROMOTING ELECTRON MOBILITY

(75) Inventors: Long-Sheng Liao, Jungli (TW); Kun-Chih Lin, Hsinchu (TW); Chia-Tien Peng, Jubei (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 10/754,060

(22) Filed: Jan. 7, 2004

(65) Prior Publication Data

US 2004/0140468 A1   Jul. 22, 2004

(30) Foreign Application Priority Data

Jan. 7, 2003   (TW) .............................. 92100245 A

(51) Int. Cl.
*H01L 29/04* (2006.01)

(52) U.S. Cl. .......................................... 257/52; 257/61

(58) Field of Classification Search .................. 257/52, 257/61, 55, 56, 62, 63, 67
See application file for complete search history.

(56) References Cited

U.S. PATENT DOCUMENTS

| 6,455,874 B1 * | 9/2002 | Park et al. ..................... 257/61 |
| 2003/0148567 A1 * | 8/2003 | Joo et al. ..................... 438/200 |

* cited by examiner

*Primary Examiner*—David Nelms
*Assistant Examiner*—Thinh T Nguyen
(74) *Attorney, Agent, or Firm*—Ladas & Parry LLP

(57) ABSTRACT

A buffer layer for promoting electron mobility. The buffer layer comprises amorphous silicon layer (a-Si) and an oxide-containing layer. The a-Si has high enough density that the particles in the substrate are prevented by the a-Si buffer layer from diffusing into the active layer. As well, the buffer, having thermal conductivity, provides a good path for thermal diffusion during the amorphous active layer's recrystallization by excimer laser annealing (ELA). Thus, the uniformity of the grain size of the crystallized silicon is improved, and electron mobility of the TFT is enhanced.

7 Claims, 4 Drawing Sheets

THIN FILM TRANSISTOR WITH BUFFER LAYER FOR PROMOTING ELECTRON MOBILITY

BACKGROUND OF THE INVENTION

1. Field of the Invention

The present invention relates to a thin film transistor, and in particular to a buffer layer within the thin film transistor for promoting electron mobility.

2. Description of the Related Art

Thin film transistor (TFT) is of the conventional LCD driver. According to the materials of active layer of TFT, the TFT can be divided into amorphous silicon TFT (a-Si:H TFT) and a polysilicon TFT. The polysilicon can also be divided into high temperature (HTPS) and low temperature polysilicon (LTPS) according to the manufacturing process.

In conventional low temperature polysilicon process, amorphous silicon is heated by excimer laser annealing (ELA) to recrystallize to form polysilicon. In order to increase adhesion, a buffer layer is usually deposited between the amorphous silicon and the substrate. The buffer layer can also serve as a block to prevent particles from diffusing into the active. The conventional buffer layer is usually silicon oxide of about 3000 Å.

Manufacture of a thick silicon oxide is time-consuming and costly. A bi-layer buffer layer comprising silicon oxide and a silicon nitride has thus been developed.

However, disadvantages of the bi-layer buffer layer were proposed by Naoya et al in the Journal of Active-Matrix Liquid-Crystal Display-TFT in 2002. Usually, hydrogen is produced by silicon nitride during manufacture. During excimer laser annealing (ELA), the hydrogen contained in the silicon nitride buffer layer diffuses into the active layer via silicon oxide buffer layer, such that stress is introduced by the hydrogen diffusion, causing limitation of grain growth. As a result, electron mobility in the active is reduced.

SUMMARY OF THE INVENTION

Accordingly, an object of the present invention is to provide a buffer layer within a thin film transistor for promoting electron mobility, such that the buffer layer can prevent particles from diffusing.

It is another object of the present invention to provide a buffer layer with high thermal conductivity coefficient providing a good path for thermal diffusion, such that the grain size of the crystallized silicon active layer is enlarged and uniform after the amorphous silicon active layer recrystallized by excimer laser annealing (ELA). The enlarged and uniform silicon layer promotes electron mobility of TFT well.

The key feature of the present invention is use of the amorphous silicon (a-Si). The a-Si has high enough density that particles in the substrate can be obstructed by the buffer layer from diffusing into the active layer. As well, the buffer layer having thermal conductivity provides a good path for thermal diffusion during formation of the amorphous active layer of a silicon recrystallized by excimer laser annealing (ELA). Thus, the uniformity of the grain size of the crystallized silicon is improved, such that electron mobility of the TFT is enhanced.

To achieve these and other advantages, the invention provides a buffer layer for promoting electron mobility, suitable for a substrate of a thin film transistor (TFT), comprising amorphous silicon layer deposited on the substrate and an oxide-containing layer deposited on the amorphous silicon layer.

According to the present invention, the oxide-containing layer comprising silicon oxide ($SiO_x$) is preferably formed by plasma enhanced chemical vapor deposition (PECVD). The thickness of the oxide-containing layer is about 1000~2000 Å, and thermal conductivity is about 1.2~1.4 $Wm^{-1}K^{-1}$.

According to the present invention, the amorphous silicon layer is preferably formed by plasma enhanced chemical vapor deposition (PECVD). The thickness of the amorphous silicon layer is about 250~1000 Å, and the density is about 2.0~2.3 $g/cm^3$. As well, hydrogen content is about 5~10%.

According to the present invention, the buffer layer further comprises a nitride layer, such as a silicon nitride, deposited between the substrate and the amorphous silicon layer.

BRIEF DESCRIPTION OF THE DRAWINGS

The present invention can be fully understood by subsequent detailed description and examples with references to the accompanying drawings, wherein.

DETAILED DESCRIPTION OF THE INVENTION

Figure 1:
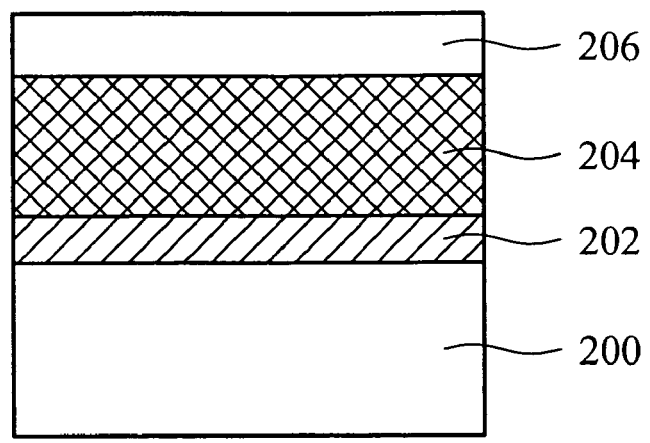
FIG. 1 is a cross-section showing the buffer layer according to a preferred embodiment of the present invention.

A preferred embodiment of the present invention is now described with reference to FIG. 1 and FIG. 2.

According to the present invention, a buffer layer 202, 204 is usually deposited on a substrate 200 of the thin film transistor (TFT). The substrate 200 comprises glass. The buffer layer 202, 204 comprises amorphous silicon (a-Si) layer 202 preferably deposited on the substrate 200 and an oxide-containing layer 204 preferably deposited on the a-Si layer 202. An active layer 206 comprising amorphous silicon is preferably deposited on the buffer layer 202, 204.

The a-Si layer 202 is preferably formed by plasma enhanced chemical vapor deposition (PECVD). The thickness of the a-Si layer 202 is about 250~1000 Å, and the density of the a-Si layer 202 is about 2.0~2.3 $g/cm^3$. The hydrogen content of the a-Si layer 202 is about 5~10% smaller than the hydrogen content of the conventional buffer, such as Silicon nitride, such that the conventional problem of impeded grain growth of the active layer 206, the result of hydrogen contained in the silicon nitride diffusing into the active layer 206 during excimer laser annealing (ELA), can be avoided.

As well, the thermal conductivity coefficient of the a-Si layer 202 is about 80~150 $Wm^{-1}K^{-1}$. The active layer 206 has to be crystallized followed by excimer laser annealing (ELA) producing an amount of heat. The a-Si layer 202 can provide a good path for thermal diffusion from the active layer 206. Thus, the grain size of the active layer can be enlarged and uniform to enhance electron mobility.

Figure 3A:
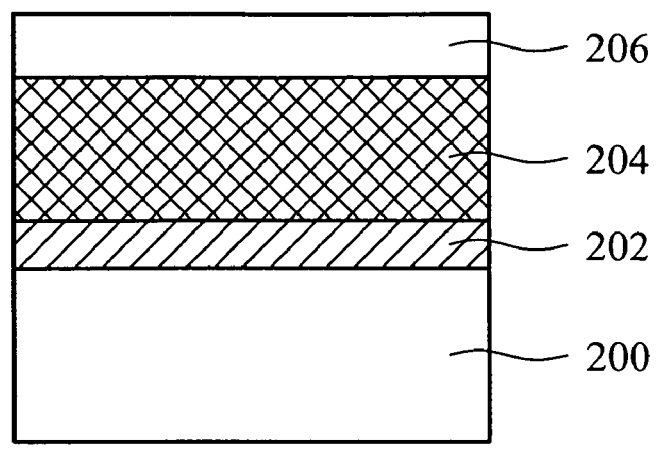
FIG. 3A through FIG. 3E are cross-sections showing the formation of TFT having the buffer layer according to a preferred embodiment of the present invention.

In FIG. 3A, first, a-Si layer 202, the oxide-containing layer 204, such as silicon oxide layer, and the active layer 206, such as amorphous active layer, are subsequently formed by deposition. The a-Si layer 202 is preferably formed by plasma enhanced chemical vapor deposition (PECVD) using the precursors comprising $SiH_4$ or $Si_2H_6$.

Figure 3B:
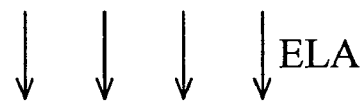
Figure 3B:
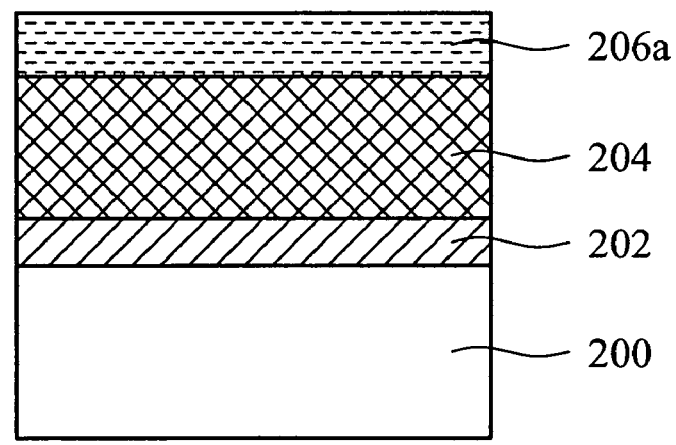

Next, excimer laser annealing is preferably performed to heat the active layer 206, as shown in FIG. 3B. The active layer 206 is recrystallized, and the heat is released by a-Si layer 202 with high thermal conductivity coefficient. Thus, a recrystallized active layer 206a with enlarged and uniform grain size is obtained.

Figure 3C:
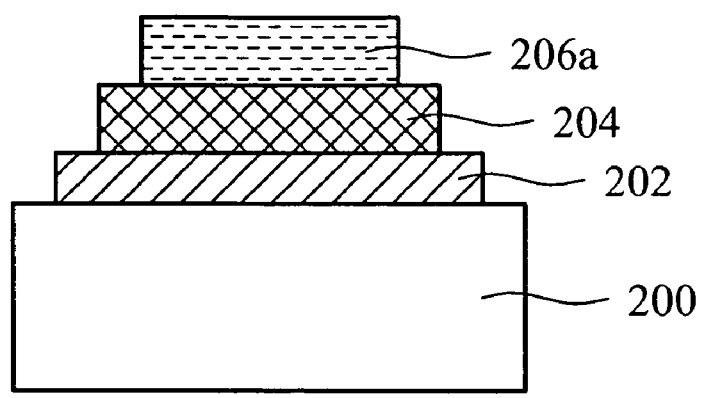

In FIG. 3C, the a-Si layer 202, the oxide-containing layer 204, and the recrystallized active layer 206a are patterned to form stacked layers for enhancing adhesion.

Figure 3D:
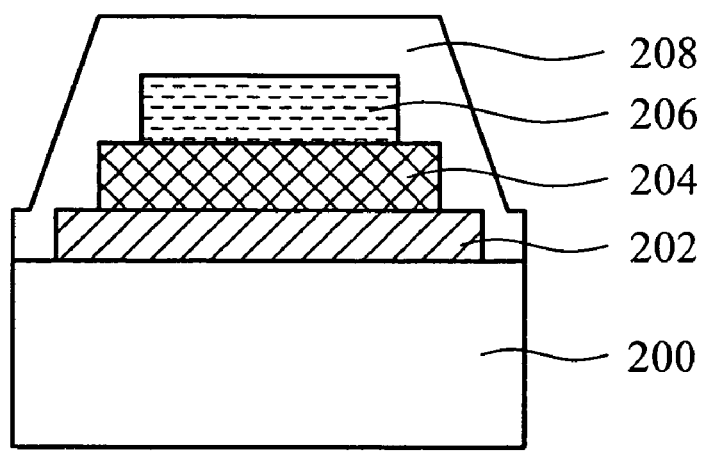
Figure 3E:
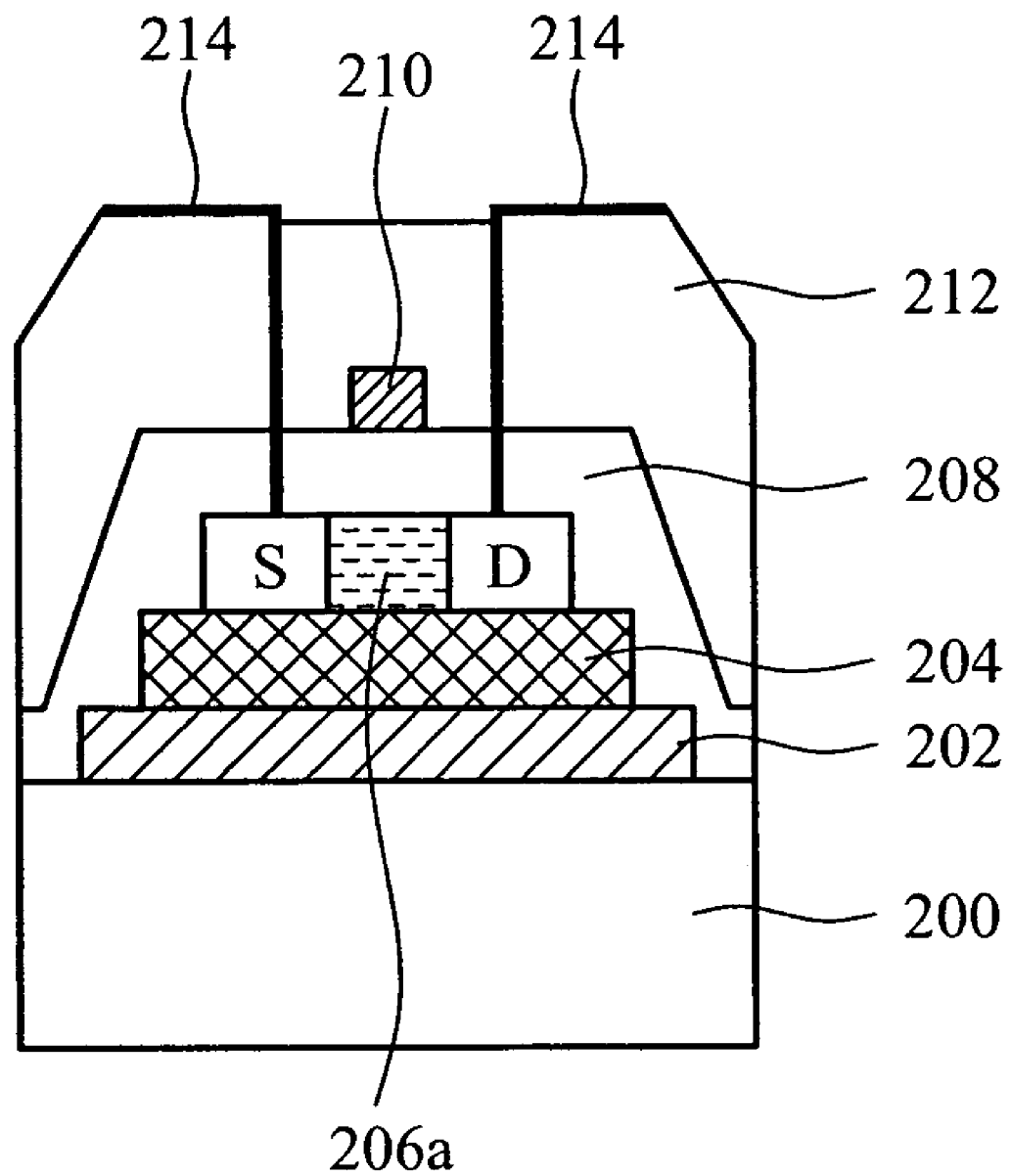

In FIG. 3D, an oxide layer 208 is deposited on the recrystallized active layer 206a. A patterned metal layer is preferably formed on the oxide layer 208 to serve as a gate 210. An ion implantation is performed on parts of the recrystallized active layer 206a not shielded by the gate 210 to form a source and a drain. Then, a dielectric layer 212 is preferably formed on the oxide layer 208 and the gate 210. Finally, contact holes are formed from the source and the drain by etching, and conductive plug fills the contact holes for electric coupling, as shown in FIG. 3E.

Figure 2:
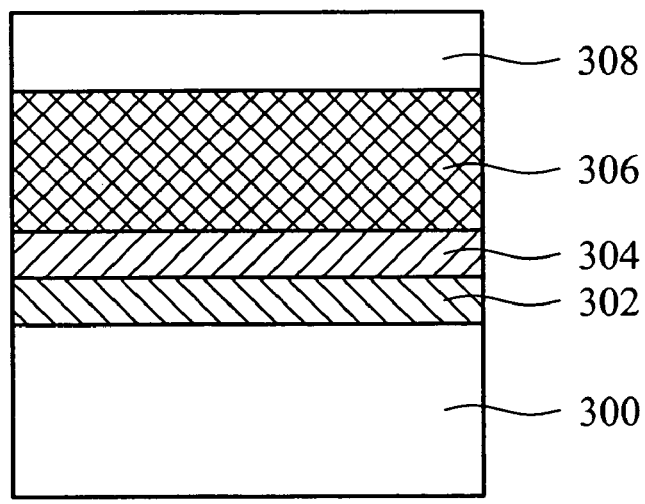
FIG. 2 is another cross-section showing the buffer layer according to a preferred embodiment of the present invention.

According to the present invention, the buffer layer can further comprise a nitride layer 302, such as silicon nitride, inserted between the substrate 300 and the amorphous silicon layer 304, as shown in FIG. 2. The oxide-containing layer 306 deposited on the amorphous silicon layer 304, and the active layer 308 comprising amorphous silicon is preferably deposited on the oxide-containing layer 306.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A thin film transistor having a buffer layer for promoting electron mobility, comprising:
    a substrate;
    a buffer layer, comprising:
        an amorphous layer, deposited on the substrate; and
        a crystallized layer, deposited on the amorphous layer;
    an active layer with source/drain regions formed therein, deposited on the crystallized layer;
    an insulating layer, covering the active layer, the amorphous layer, crystallized layer and the side walls of the active layer;
    a conductive layer, deposited on the insulating layer above parts of the active layer; and a dielectric layer, completely covering the crystallized layer and the conductive layer.

2. The buffer layer as claimed in claim 1, wherein the crystallized layer comprises oxide.

3. The buffer layer as claimed in claim 1, wherein the thickness of the crystallized layer is about 1000~2000 Å.

4. The buffer layer as claimed in claim 1, wherein the amorphous layer comprises amorphous silicon.

5. The buffer layer as claimed in claim 1, wherein the thickness of the amorphous layer is about 1000~2000 Å.

6. The buffer layer as claimed in claim 1, wherein the hydrogen content of the amorphous layer is less than 10%.

7. The buffer layer as claimed in claim 1, wherein the buffer layer further comprises silicon nitride deposited between the substrate and the amorphous layer.

\* \* \* \* \*